United States Patent [19]

Taralp

[11] Patent Number: 5,164,682
[45] Date of Patent: Nov. 17, 1992

[54] TWO-PORT WIDEBAND BIPOLAR TRANSISTOR AMPLIFIERS

[76] Inventor: Güner Taralp, 18 Letchworth Road, Ottawa, Ontario, Canada, K1S 0J4

[21] Appl. No.: 735,221

[22] Filed: Jul. 24, 1991

[51] Int. Cl.⁵ ............................................. H03F 1/14
[52] U.S. Cl. ..................................... 330/292; 330/79; 330/171
[58] Field of Search ................ 330/79, 109, 165, 171, 330/188, 190, 195, 197, 292, 294, 302

[56] References Cited

U.S. PATENT DOCUMENTS

| | | | |
|---|---|---|---|
| 3,353,130 | 11/1967 | Silverstein | 336/82 |
| 3,546,613 | 12/1970 | Breuer | 330/292 |
| 4,156,173 | 5/1979 | Taralp | 323/17 |
| 4,590,434 | 5/1986 | Wagner | 330/79 X |

Primary Examiner—Steven Mottola

[57] ABSTRACT

A wideband amplifier comprises a dual-emitter bipolar transistor arrangement with coaxial transformers, each having a high turns ratio and tight coupling between a first toroidal winding on an annular ferrite core and a second, single-turn, winding constituted by a metal container of the transformer. The second windings are coupled between respective emitters and signal ground, and the first windings are connected between the transistor base and collector, respectively, and signal ground. An input signal is supplied to the base, and an output signal is derived from the collector. The dual-emitter bipolar transistor, which has four terminals, is thereby transformed into a two-port (input port and output port) device which facilitates impedance matching, provides a linear and constant gain over a large bandwidth, provides high isolation of the input from the output, and provides low noise at the input and a high level at the output.

20 Claims, 2 Drawing Sheets

TWO-PORT WIDEBAND BIPOLAR TRANSISTOR AMPLIFIERS

This invention relates to amplifiers, and is particularly concerned with wideband bipolar transistor amplifiers in which transformers are used for signal coupling so that a bipolar transistor, which is a three-terminal device, becomes a two-port device, with one input port and one output port. The term wideband is used in this specification to refer to radio frequency signals, for example in a range from about 1 MHz to about 1 GHz.

BACKGROUND OF THE INVENTION

In Taralp U.S. Pat. No. 4,156,173 issued May 22, 1979 and entitled "Input Impedance Matching Of A Bipolar Transistor Amplifier Employing A Coaxial Transformer", there is described a common emitter bipolar transistor amplifier for signals in the VHF (30 to 300 MHz) range in which a coaxial transformer is used for impedance matching between the amplifier and the signal source. The signal source typically has an impedance of 50 Ω, whereas the base-emitter circuit of the bipolar transistor of the amplifier typically has an impedance which is much higher than this. Accordingly, the coaxial transformer has a relatively high turns ratio, for example 5:1, to provide a desired high (25:1) impedance transformation ratio.

As described in U.S. Pat. No. 4,156,173, the coaxial transformer comprises a first winding on a ferrite toroidal core which is substantially surrounded by a metal enclosure which constitutes a single turn second winding of the transformer. A transformer of this general type is also described in Silverstein U.S. Pat. No. 3,353,130 issued Nov. 14, 1967 and entitled "High Ratio Vacuum Tube Input Transformer". The coaxial transformer provides both the high turns ratio which is necessary for impedance matching of the input of the amplifier, and tight coupling between the transformer windings which is necessary for the required bandwidth of the amplifier.

U.S. Pat. No. 4,156,173 is concerned only with impedance matching of the input of the amplifier, which contributes to low noise. It does not discuss other characteristics of the amplifier such as amplifier efficiency, linearity, and isolation between the input and output of the amplifier. In addition, the patent illustrates a load in the collector circuit of the transistor, but does not describe the nature or impedance of this and does not address impedance matching between the amplifier and the load.

Isolation between the output and the input of a wideband amplifier is particularly important in view of the situations in which such an amplifier may be used. For example, such an amplifier may be used to drive a transmission line or with a following mixer circuit, either of which may reflect signals back to the amplifier output. Unless the amplifier has very good isolation between its output and input circuits, such undesired reflected signals will be communicated at least in part to the input circuitry of the amplifier and cause seriously degraded performance (e.g. magnitude and phase characteristics, and to a lesser extent noise figure) of the amplifier.

Linearity of a wideband amplifier is also very important, it being desirable for a wideband amplifier to have a constant gain for all input signal levels over the wide range of operating frequencies, or bandwidth, of the amplifier. In addition, a relatively high amplifier efficiency (for a Class A amplifier) is desirable in order to reduce power consumption and dissipation, especially when such amplifiers are used in densely packed circuitry such as is increasingly common using surface-mount technology.

An object of this invention, therefore, is to provide an improved wideband bipolar transistor amplifier.

To this end, the invention utilizes a dual-emitter bipolar transistor arrangement in conjunction with two high-ratio transformers for maximum signal coupling at the input and output port.

SUMMARY OF THE INVENTION

According to one aspect of this invention there is provided a wideband amplifier comprising: a bipolar transistor arrangement including a base, a collector, and first and second emitters; a first transformer for coupling a signal to be amplified between the base and the first emitter, the first transformer including a first winding coupled between the base and signal ground, and a second winding coupled between the first emitter and signal ground; and a second transformer for deriving an amplified signal from the collector and the second emitter, the second transformer including a first winding coupled between the collector and signal ground, and a second winding coupled between the second emitter and signal ground.

The term "signal ground" is used herein to refer to points which are grounded for signal or a.c. purposes, but which for d.c. may not be at ground potential but may be at some other potential for example for appropriately biasing the bipolar transistor arrangement.

The first and second transformers have the effect of transforming the bipolar transistor arrangement, which is essentially a three-terminal or three-port device, into a two-port device, namely an input port and an output port.

The bipolar transistor arrangement can comprise a dual-emitter bipolar transistor, or it can comprise a first bipolar transistor having a base, collector, and emitter constituting respectively the base, collector, and first emitter of the bipolar transistor arrangement, and a second bipolar transistor having a base connected to the base of the first bipolar transistor, a collector connected to the collector of the first bipolar transistor, and an emitter constituting the second emitter of the bipolar transistor arrangement. In the latter case the second bipolar transistor can be a Darlington transistor, or two transistors interconnected in Darlington configuration, to provide the amplifier with an enhanced bandwidth.

Such an amplifier facilitates the provision of independently matched impedances at the input and the output, linear and constant gain over a large bandwidth, and excellent isolation of the input from the output. The amplifier characteristics can be further enhanced by a capacitor connected between the base and the second emitter of the bipolar transistor arrangement, and/or a capacitor connected between the collector and the first emitter of the bipolar transistor arrangement, in either case for compensating for collector-base capacitance of the bipolar transistor arrangement. In addition, a capacitor can be connected between the first and second emitters of the bipolar transistor arrangement.

In order to provide a relatively high turns ratio and tight coupling, each transformer preferably comprises a coaxial structure in which the first winding comprises a toroidal winding on an annular ferrite core, and the second winding comprises a single turn constituted by a metal container surrounding and extending through the ferrite core and the first winding. The first winding of each transformer can have at least about 10 turns whereby a turns ratio of the first winding to the second winding of the transformer is at least about 10:1.

According to another aspect this invention provides an amplifier comprising: a bipolar transistor arrangement including a base, a collector, and first and second emitters; a first transformer including a first winding coupled between the base and signal ground and a second winding coupled between the first emitter and signal ground; a second transformer including a first winding coupled between the collector and signal ground and a second winding coupled between the second emitter and signal ground; means for supplying a signal to be amplified to the base; and means for deriving an amplified signal from the collector; wherein at least one of the first and second transformers is a coaxial transformer whose first winding comprises a toroidal winding on an annular ferrite core and whose second winding comprises a single turn constituted by a metal container surrounding and extending through the ferrite core and the first winding.

Preferably both of the first and second transformers are coaxial transformers.

According to a further aspect this invention provides a wideband amplifier comprising: a bipolar transistor including a base, a collector, and an emitter; means for supplying a signal to the transistor to be amplified thereby; and a transformer for deriving an amplified signal from the transistor, the transformer including a first winding coupled between the collector and signal ground and a second winding coupled between the emitter and signal ground, wherein the first winding comprises a toroidal winding on an annular ferrite core and the second winding comprises a single turn constituted by a metal container surrounding and extending through the ferrite core and the first winding.

In this case the bipolar transistor preferably includes a further emitter and the means for supplying a signal to the transistor comprises a transformer including a first winding coupled between the base and signal ground and a second winding coupled between the further emitter and signal ground, wherein the first winding comprises a toroidal winding on an annular ferrite core and the second winding comprises a single turn constituted by a metal container surrounding and extending through the ferrite core and the first winding.

BRIEF DESCRIPTION OF THE DRAWINGS

The invention will be further understood from the following description with reference to the accompanying drawings, in which the same references are used in different figures to denote similar elements and in which.

DESCRIPTION OF THE PREFERRED EMBODIMENTS

Figure 1:
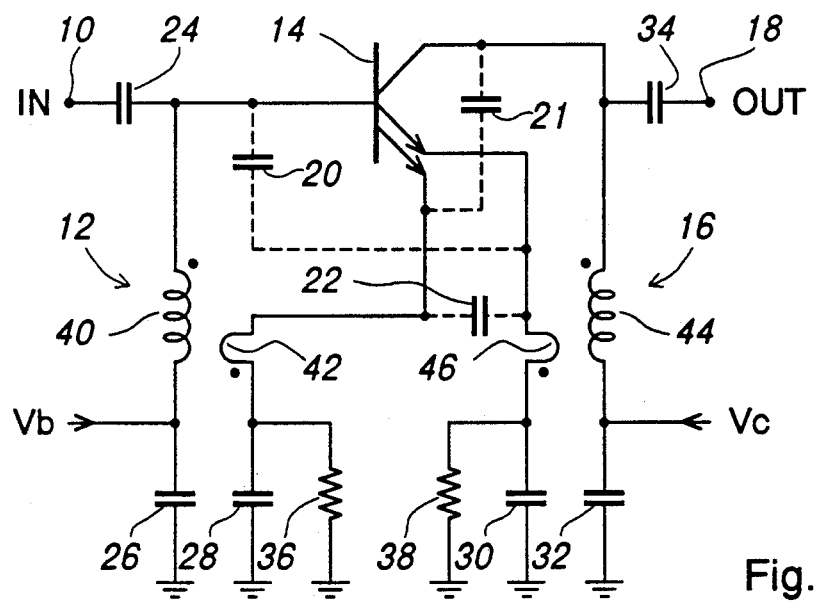
FIG. 1 is a schematic circuit diagram of a wideband amplifier in accordance with an embodiment of this invention.

Referring to FIG. 1, there is illustrated a wideband bipolar transistor amplifier in accordance with an embodiment of this invention, for amplifying signals at radio frequencies in a range from about 1 MHz up to hundreds of MHz or about 1 GHz. The amplifier comprises an input 10 to which a signal to be amplified is supplied, a first transofrmer 12, a dual-emitter bipolar transistor 14, a second transformer 16, and an output 18 at which an amplified signal is produced. FIG. 1 also shows capacitors 20, 21, and 22; these are optional components as described below and accordingly their connections are shown in FIG. 1 by broken lines. The remainder of the components of the amplifier of FIG. 1 serve for d.c. biasing and d.c. isolation of the transistor 14, and are described further below. These remaining components comprise capacitors 24, 26, 28, 30, 32, and 34, resistors 36 and 38, and supply voltages Vb and Vc which may for example be about +1 volt and +3 to +5 volts, respectively, relative to d.c. ground. The voltage Vc may be increased for higher power amplifiers.

Each of the transformers 12 and 16 provides a high turns ratio and a tight coupling between a first winding and a second winding. In order to provide such a high turns ratio, for example in a range from 10:1 (or less, e.g. 6:1 or 8:1, especially for low bias currents) to about 20:1 or 30:1, and maintain a tight coupling which is necessary to achieve wideband operation of the amplifier, each of these transformers is in the form of a coaxial transformer as described below with reference to FIG. 2. The first and second windings of the first transformer 12 are referenced 40 and 42 respectively, and the first and second windings of the second transformer 16 are referenced 44 and 46 respectively.

The base of the transistor 14 is coupled to the input 10 via the the capacitor 24, and to signal ground via the first winding 40 of the first transformer 12 which is connected to d.c. ground via the decoupling capacitor 26. The supply voltage Vb is applied to the junction between the capacitor 26 and the first winding 40, to provide a desired base d.c. bias for the transistor 14. A first emitter of the transistor 14 is coupled to signal ground via the second winding 42 of the first transformer 12 which is connected to d.c. ground via the decoupling capacitor 28. The resistor 36 is connected in parallel with the capacitor 28 to determine a desired emitter current for this first emitter.

Correspondingly, the collector of the transistor 14 is coupled to the output 18 via the capacitor 34, and to signal ground via the first winding 44 of the second transformer 16 which is connected to d.c. ground via the decoupling capacitor 32. The supply voltage Vc is applied to the junction between the capacitor 32 and the first winding 44, to provide a desired collector d.c. bias for the transistor 14. A second emitter of the transistor 14 is coupled to signal ground via the second winding 46 of the second transformer 16 which is connected to d.c. ground via the decoupling capacitor 30. The resistor 38 is connected in parallel with the capacitor 30 to determine a desired emitter current for this second emitter.

Figure 3:
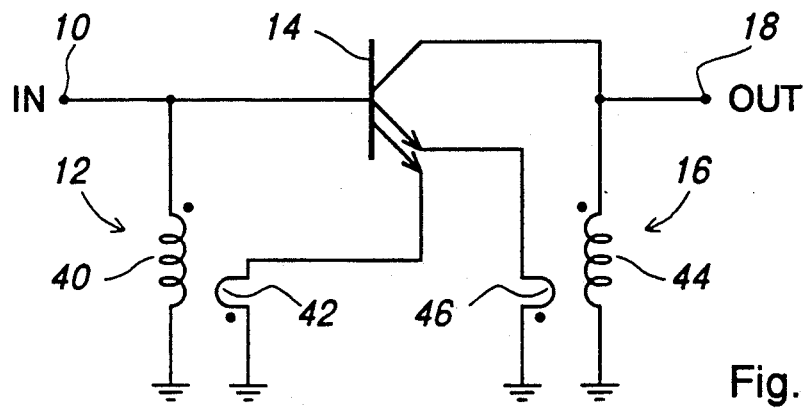
FIG. 3 is a simplified schematic circuit diagram of the wideband amplifier of FIG. 1, illustrating only the a.c. signal circuits.

For simplicity, FIG. 3 illustrates the amplifier of FIG. 1 but shows only the a.c. signal components without illustrating any of the d.c. biasing and d.c. isolation components. Thus all of the ground points shown in FIG. 3 are signal or a.c. ground points. From FIG. 3 it can be clearly seen that the amplifier comprises essentially only three components, namely the first transformer 12, the dual-emitter transistor 14, and the second transformer 16. As is clearly shown in FIG. 3, the first and second windings 40 and 42 of the first transformer 12 are coupled between the base and signal ground and between the first emitter and signal ground respectively, and the first and second windings 44 and 46 of the second transformer 16 are coupled between the collector and signal ground and between the second emitter and signal ground respectively.

Figure 4:
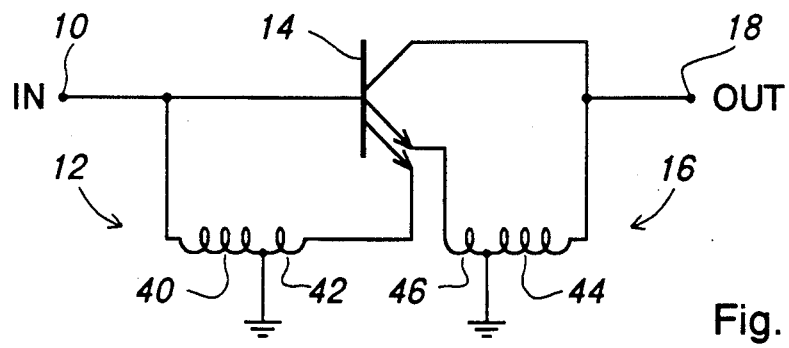
FIG. 4 shows the circuit diagram of FIG. 3 in an alternative form.

FIG. 4 illustrates the amplifier in a similar manner to FIG. 3 but with a different arrangement to illustrate the transformation of the bipolar transistor 14, which is essentially a three-terminal or three-port device, into a two-port amplifier in which the input 10 constitutes an input port and the output 18 constitutes an output port of the amplifier.

As shown by broken lines in FIG. 1, the capacitor 20, having a capacitance of the order of a few pF, may optionally be connected between the base and the second emitter of the transistor 14, in order to compensate for the collector-base capacitance of the transistor 14 and thereby improve the performance of the amplifier. The capacitor 21 can alternatively or additionally be provided for the same purpose. In addition, the capacitor 22, having a capacitance of the order of a few tens of pF, may optionally be connected between the first and second emitters of the transistor 14 to improve stability of the amplifier.

Figure 2:
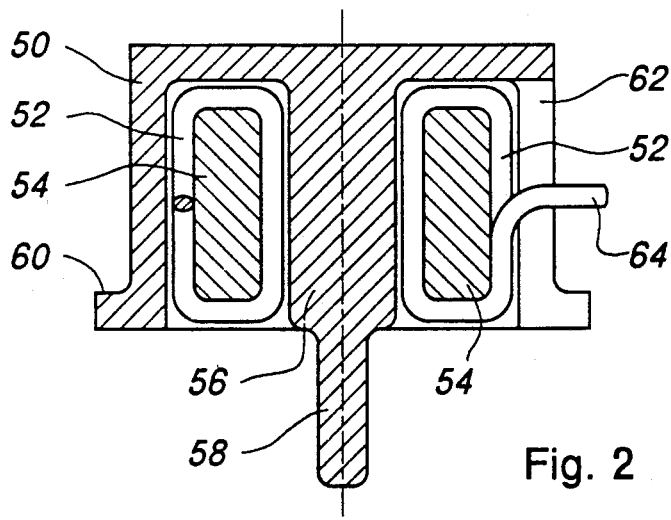
FIG. 2 is a cross-sectional illustration of a coaxial transformer which is used in the amplifier of FIG. 1.

FIG. 2 illustrates, in a much enlarged and cross-sectional view, a coaxial transformer which is desirably used for each of the transformers 12 and 16. As has already been indicated above, a coaxial transformer is used to provide the combined features of a high turns ratio and tight coupling between the windings.

Referring to FIG. 2, the coaxial transformer consists of a metal cylindrical container or shell 50, within the round body of which there is a toroidal winding 52 on an annular ferrite core 54. An inner axial post 56 of the shell 50 extends through the center of the winding 52 and core 54, and projects to form a connection pin 58, and an outer flange 60 of the shell 50 provides for convenient surface mounting of the transformer. The shell 50 thereby constitutes a single-turn winding of the transformer. The outside of the shell 50, and the flange 60, can be of arbitrary shape and can conveniently be square or round. The ends of the winding 52 extend through a slot 62 at one point around the periphery of the shell 50, as shown for one end 64 of this winding, and can be terminated in any convenient manner, for example with surface-mount solder pads (not shown).

By way of example, the shell 50 can have a height of 2 mm and inner and outer diameters of 2.9 mm and 3.2 mm respectively, with the flange 60 being square with a side of 3.7 mm or being round with a diameter of 5 mm, in either case to facilitate providing a low impedance connection. The ferrite core 54 can be Indiana General type BBR7404, and the toroidal winding 52 can comprise a desired number of (e.g. 10 to 20 or 30) turns of 41 or 42 gauge enamelled wire, extending around the entire periphery of the core 54. The toroidal winding 52 constitutes the first winding 40 or 44 of the transformer 12 or 16 respectively, and the shell 50 constitutes the second winding 42 or 46 of the transformer 12 or 16 respectively.

As can be appreciated from the small size of the coaxial transformer and the few components which are required for the amplifier, the amplifier of FIG. 1 can be constructed in a very small space using surface-mount technology. Such an amplifier has been found to achieve wideband operation in a highly linear manner, i.e. with a gain which is substantially constant for various signal levels and for any frequency over the bandwidth, and with relatively high efficiency because, as can be seen from FIGS. 3 and 4, the only resistive losses to which the signal is subject are those inherent in the transformers 12 and 16 and the transistor 14. At the same time, the amplifier provides high isolation of the input from the output, for example an isolation of the order of 50 dB at 200 MHz for an amplifier with a bandwidth of 300 MHz or more. These characteristics can be further improved by using the optional capacitors 20 to 22.

The high isolation of the input from the output provided by the amplifier can be appreciated from the fact that, as illustrated in FIG. 1 and more simply in FIGS. 3 and 4, the output and input circuitry are completely separate, linked only through the dual emitters of the transistor 14. This isolation also facilitates independent matching of impedances at both the input and output, by appropriate selection of the transformer turns ratios and/or adjustment of the bias voltages Vb and Vc.

To further facilitate impedance matching without requiring changes to these bias voltages, each transformer can optionally include a third winding used in the same manner as described with reference to FIG. 5 of U.S. Pat. No. 4,156,173. In this case the input 10 would be coupled to ground, via a third winding of the transformer 12, instead of being coupled directly to the base of the transistor 14. Similarly the output 18 would be coupled to ground, via a third winding of the transformer 16, instead of being coupled directly to the collector of the transistor 14.

The impedance matching can be further enhanced, especially at high frequencies, by fine tuning at the input and output using series inductors and/or shunt capacitors in known manner. As the amplifier facilitates impedance matching independently at the input and the output, it can also be conveniently used as an impedance matching amplifier, for example to match a 50 Ω source to a 75 Ω load.

Figure 5:
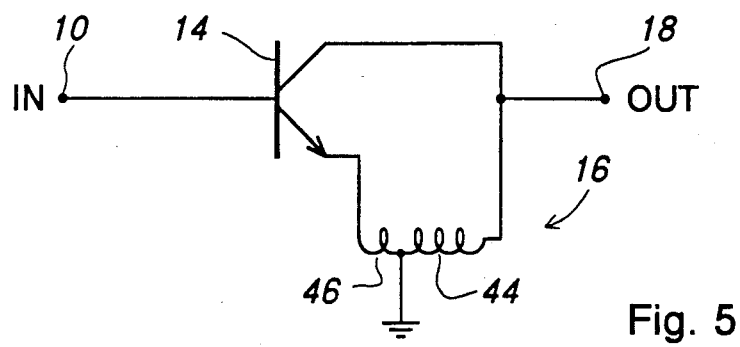
FIG. 5 is a simplified schematic diagram similar to FIG. 4 of a wideband amplifier in accordance with another embodiment of the invention.

FIG. 5 illustrates an alternative form of wideband amplifier which is similar to the amplifier as illustrated in FIG. 4 except in that the transformer matching at the input is dispensed with. Thus the amplifier of FIG. 5 consists of only the bipolar transistor 14, which in this case does not have a dual emitter and simply has its base connected to the input 10, and the transformer 16 connected in the emitter and collector circuits of the transistor 14 and providing output matching in the same manner as described above.

Figure 6:
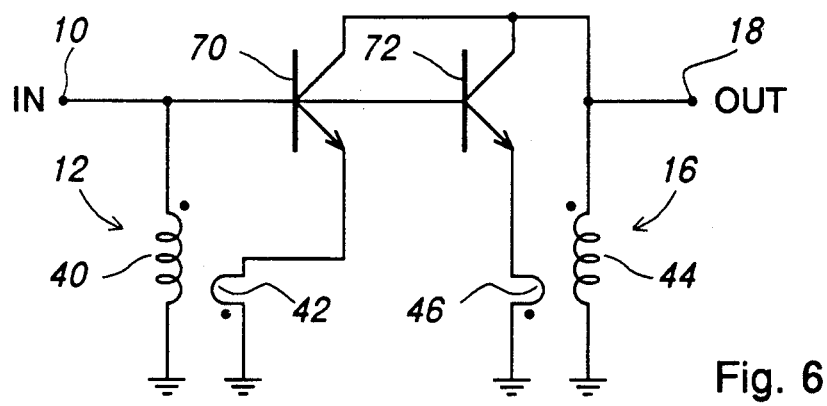
FIGS. 6 and 7 are simplified schematic circuit diagrams similar to FIG. 3 of wideband amplifiers in accordance with alternative embodiments of this invention.

Although as described above with reference to FIGS. 1 and 3 the transistor 14 has a dual-emitter structure, an equivalent transistor arrangement can be provided using two separate bipolar transistors. Such an alternative arrangement is illustrated in FIG. 6, in a similar manner to FIG. 3 for simplicity. D.c. biasing and d.c. isolation would be provided for the amplifier of FIG. 6 in a similar manner to that shown in FIG. 1. In FIG. 6, the optional capacitors 20 to 22 of FIG. 1 can also be provided in a similar manner.

The amplifier of FIG. 6 differs from that of FIGS. 1, 3, and 4 as described above only in that, instead of the dual-emitter transistor 14, two separate transistors 70 and 72 are used, with their bases connected together and coupled to the input 10, their collectors connected together and coupled to the output 18, and their emitters connected to the second windings 42 and 46, respectively, of the transformers 12 and 16 respectively. The transistors 70 and 72 can be the same type or different types; for example, they may both be Siemens type BFP81 transistors.

Figure 7:
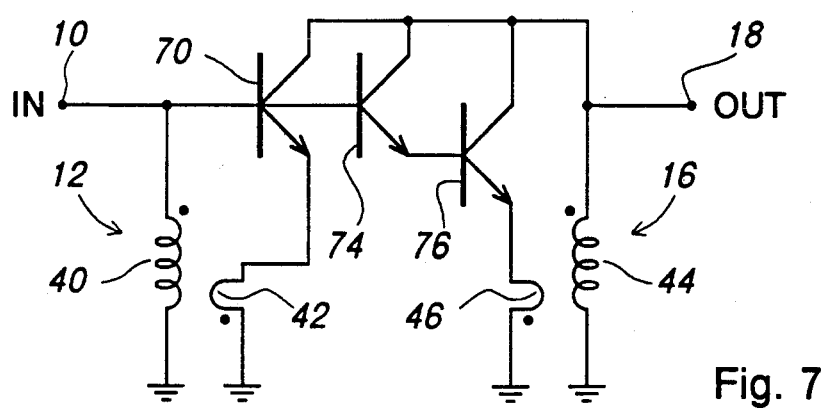

FIG. 7 illustrates an alternative embodiment of the invention which is similar to that of FIG. 6 except in that, in order to provide a greater bandwidth, the transistor 72 is replaced by two transistors 74 and 76 which are interconnected in Darlington configuration. The two transistors 74 and 76, instead of being separate devices, could be constituted by a Darlington transistor with this configuration.

Numerous other modifications, variations, and adaptations may be made to the particular embodiments of the invention described above without departing from the scope of the invention as defined in the claims.

What is claimed is:

1. A wideband amplifier comprising:
   a bipolar transistor arrangement including a base, a collector, and first and second emitters;
   a first transformer for coupling a signal to be amplified between the base and the first emitter, the first transformer including a first winding coupled between the base and signal ground, and a second winding coupled between the first emitter and signal ground; and
   a second transformer for deriving an amplified signal from the collector and the second emitter, the second transformer including a first winding coupled between the collector and signal ground, and a second winding coupled between the second emitter and signal ground.

2. An amplifier as claimed in claim 1 wherein the bipolar transistor arrangement comprises a dual-emitter bipolar transistor.

3. An amplifier as claimed in claim 1 wherein the bipolar transistor arrangement comprises a first bipolar transistor having a base, collector, and emitter constituting respectively the base, collector, and first emitter of the bipolar transistor arrangement, and a second bipolar transistor having a base connected to the base of the first bipolar transistor, a collector connected to the collector of the first bipolar transistor, and an emitter constituting the second emitter of the bipolar transistor arrangement.

4. An amplifier as claimed in claim 1 and including a capacitor connected between the base and the second emitter of the bipolar transistor arrangement.

5. An amplifier as claimed in claim 1 and including a capacitor connected between the collector and the first emitter of the bipolar transistor arrangement.

6. An amplifier as claimed in claim 1 and including a capacitor connected between the first and second emitters of the bipolar transistor arrangement.

7. An amplifier as claimed in claim 1 wherein a turns ratio of the first winding to the second winding of the first transformer is at least about 10:1.

8. An amplifier as claimed in claim 1 wherein the second winding of the first transformer has a single turn.

9. An amplifier as claimed in claim 1 wherein the first winding of the first transformer comprises a toroidal winding on an annular ferrite core, and the second winding of the first transformer comprises a single turn constituted by a metal container surrounding and extending through the ferrite core and the first winding.

10. An amplifier as claimed in claim 9 wherein the first winding of the first transformer has at least about 10 turns whereby a turns ratio of the first winding to the second winding of the first transformer is at least about 10:1.

11. An amplifier as claimed in claim 1 wherein a turns ratio of the first winding to the second winding of the second transformer is at least about 10:1.

12. An amplifier as claimed in claim 1 wherein the second winding of the second transformer has a single turn.

13. An amplifier as claimed in claim 1 wherein the first winding of the second transformer comprises a toroidal winding on an annular ferrite core, and the second winding of the second transformer comprises a single turn constituted by a metal container surrounding and extending through the ferrite core and the first winding.

14. An amplifier as claimed in claim 13 wherein the first winding of the second transformer has at least about 10 turns whereby a turns ratio of the first winding to the second winding of the second transformer is at least about 10:1.

15. An amplifier comprising:
   a bipolar transistor arrangement including a base, a collector, and first and second emitters;
   a first transformer including a first winding coupled between the base and signal ground and a second winding coupled between the first emitter and signal ground;
   a second transformer including a first winding coupled between the collector and signal ground and a second winding coupled between the second emitter and signal ground;
   means for supplying a signal to be amplified to the base; and
   means for deriving an amplified signal from the collector;
   wherein at least one of the first and second transformers is a coaxial transformer whose first winding comprises a toroidal winding on an annular ferrite core and whose second winding comprises a single turn constituted by a metal container surrounding and extending through the ferrite core and the first winding.

16. An amplifier as claimed in claim 15 wherein both of the first and second transformers are coaxial transformers.

17. An amplifier as claimed in claim 16 and including a capacitor connected between the base and the second emitter or between the collector and the first emitter of the bipolar transistor arrangement.

18. An amplifier as claimed in claim 16 and including a capacitor connected between the first and second emitters of the bipolar transistor arrangement.

19. A wideband amplifier comprising:
   a bipolar transistor including a base, a collector, and an emitter;
   means for supplying a signal to the base of the transistor to be amplified thereby, the base of the transistor being isolated from the collector; and a transformer for deriving an amplified signal from the transistor, the transformer including a first winding coupled between the collector and signal ground and a second winding coupled between the emitter and signal ground, wherein the first winding comprises a toroidal winding on an annular ferrite core and the second winding comprises a single turn constituted by a metal container surrounding and extending through the ferrite core and the first winding, a turns ratio of the first winding to the second winding being at least 6:1.

20. An amplifier as claimed in claim 19 wherein the bipolar transistor includes a further emitter and the means for supplying a signal to the base of the transistor comprises a transformer including a first winding coupled between the base and signal ground and a second winding coupled between the further emitter and signal ground, wherein the first winding comprises a toroidal winding on an annular ferrite core and the second winding comprises a single turn constituted by a metal container surrounding and extending through the ferrite core and the first winding.

* * * * *